United States Patent
Taniguchi et al.

(10) Patent No.: US 10,529,642 B2
(45) Date of Patent: Jan. 7, 2020

(54) POWER SEMICONDUCTOR DEVICE

(71) Applicant: FUJI ELECTRIC CO., LTD., Kawasaki (JP)

(72) Inventors: Katsumi Taniguchi, Matsumoto (JP); Motohito Hori, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/141,026

(22) Filed: Sep. 25, 2018

(65) Prior Publication Data

US 2019/0148258 A1 May 16, 2019

(30) Foreign Application Priority Data

Nov. 16, 2017 (JP) .................................. 2017-221002

(51) Int. Cl.
*H01L 23/367* (2006.01)
*H01L 23/42* (2006.01)
*H01L 23/498* (2006.01)

(52) U.S. Cl.
CPC ............ *H01L 23/367* (2013.01); *H01L 23/42* (2013.01); *H01L 23/49838* (2013.01)

(58) Field of Classification Search
CPC ............................ H01L 23/367; H01L 23/647
See application file for complete search history.

(56) References Cited

U.S. PATENT DOCUMENTS

| | | | |
|---|---|---|---|
| 5,889,325 A * | 3/1999 | Uchida | ............... H01L 23/3121 |
| | | | 257/664 |
| 6,373,129 B1 | 4/2002 | Yamazaki et al. | |
| 8,975,663 B2 | 3/2015 | Okamoto | |
| 2014/0070269 A1 | 3/2014 | Okamoto | |
| 2015/0223339 A1 | 8/2015 | Nakamura et al. | |

FOREIGN PATENT DOCUMENTS

| | | |
|---|---|---|
| JP | 10-150142 A | 6/1998 |
| JP | 2001-36002 A | 2/2001 |
| JP | 2012-191010 A | 10/2012 |
| JP | 2013-239697 A | 11/2013 |
| JP | 2014-57007 A | 3/2014 |
| WO | 2014/061211 A1 | 4/2014 |

* cited by examiner

*Primary Examiner* — Quoc D Hoang (57) ABSTRACT

The semiconductor device includes a first conductive layer, semiconductor elements bonded to the upper surface of the first conductive layer, a second conductive layer separated from the first conductive layer, a control terminal bonded to the second conductive layer, a control resistor bonded to the upper surface of the second conductive layer, a control-resistor pin bonded to the upper surface of the control resistor and a wiring board having a control-wiring layer for electrically connecting the semiconductor elements and the control-resistor pin.

5 Claims, 7 Drawing Sheets

POWER SEMICONDUCTOR DEVICE

CROSS REFERENCE TO RELATED APPLICATIONS

This application is based upon and claims the benefit of priority from the prior Japanese Patent Application No. P2017-221002 filed on Nov. 16, 2017, the entire contents of which are incorporated herein by reference.

BACKGROUND OF THE INVENTION

1. Field of the Invention

The present invention relates to a power semiconductor device.

2. Description of the Related Art

Power semiconductor devices in which a plurality of semiconductor elements are connected in parallel to each other to increase the rated current, are known by JP 2012-191010A and WO 2014/061211. In such power semiconductor devices, a plurality of resonance loops are generated due to parasitic inductances of wirings and parasitic capacitances of semiconductor elements. Since, in the power semiconductor device, the semiconductor elements having various characteristics are used, calculation of resonance frequency in the power semiconductor device is complicated. When the resonance frequency in the resonance loop matches the characteristics of the semiconductor element, oscillation will occur. For solving the oscillation problem, a technique for suppressing oscillation by connecting a control resistor for each semiconductor element is known by JP H10-150142A, JP 2001-36002A and JP 2014-57007A.

JP 2013-239697A discloses a power semiconductor device capable of preventing electrostatic damage by providing a chip resistor connected between the gate and the emitter of the insulated gate bipolar transistor (IGBT) as a static-electricity preventing member, without using a removable static-electricity preventing member.

In the techniques described in JP H10-150142A, JP 2001-36002A and JP 2014-57007A, since one gate resistor is mounted to each semiconductor element, the size of the power semiconductor device increases. Further, the gate resistor is mounted in the vicinity of the semiconductor element, and thus the temperature easily rises due to heat generation in the semiconductor element. Since the gate resistor has high temperature dependency, there is a possibility that a desired effectivity cannot be obtained due to a change in resistance value by the temperature rise of the gate resistor. Note that, it is desirable that the length of the wiring connecting the gate resistor is as short as possible in order to suppress an increase in inductance.

SUMMARY OF THE INVENTION

An aspect of the present invention inheres in a power semiconductor device scheduled to be mounted on an upper surface of a heat sink, the power semiconductor device encompassing: (a) a first conductive layer designed to be disposed in parallel with the upper surface of the heat sink; (b) a plurality of semiconductor elements having control electrodes, mounted on an upper surface of the first conductive layer, respectively; a second conductive layer designed to be thermally connected to an upper surface of the heat sink and mounted to separate from the first conductive layer; (c) a control resistor having a first electrode and a second electrode, mounted on the upper surface of the second conductive layer; (d) a control terminal electrically connected to the first electrode of the control resistor; (e) a control-resistor pin electrically connected to the second electrode of the control resistor; (f) a plurality of control-electrode pins connected to each of the control electrodes; and (g) a wiring board having a control-wiring layer which holds the control-resistor pin and each of the control-electrode pins so as to electrically connect between the control-electrode pin and each of the control-resistor pins.

DETAILED DESCRIPTION

Exemplary embodiments of the present invention will be described below with reference to the drawings. In the descriptions of the drawings to be referred, the same or similar elements are indicated by the same or similar reference numerals. It should be understood that the drawings are illustrated schematically, and relationships of thicknesses and planar dimensions, and thickness proportions of the respective devices and elements are not drawn to scale. The specific thicknesses and dimensions should be considered in accordance with the following descriptions. It should also be understood that the respective drawings are illustrated with the dimensional relationships and proportions different from each other.

In the following descriptions, the terms relating to directions, such as "left and right" and "top and bottom" are merely defined for illustration purposes, and thus, such definitions do not limit the technical spirit of the present invention. Therefore, for example, when the paper plane is rotated by 90 degrees, the "left and right" and the "top and bottom" are read in exchange. When the paper plane is rotated by 180 degrees, the "top" is changed to the "bottom", and the "bottom" is changed to the "top".

Figure 1:
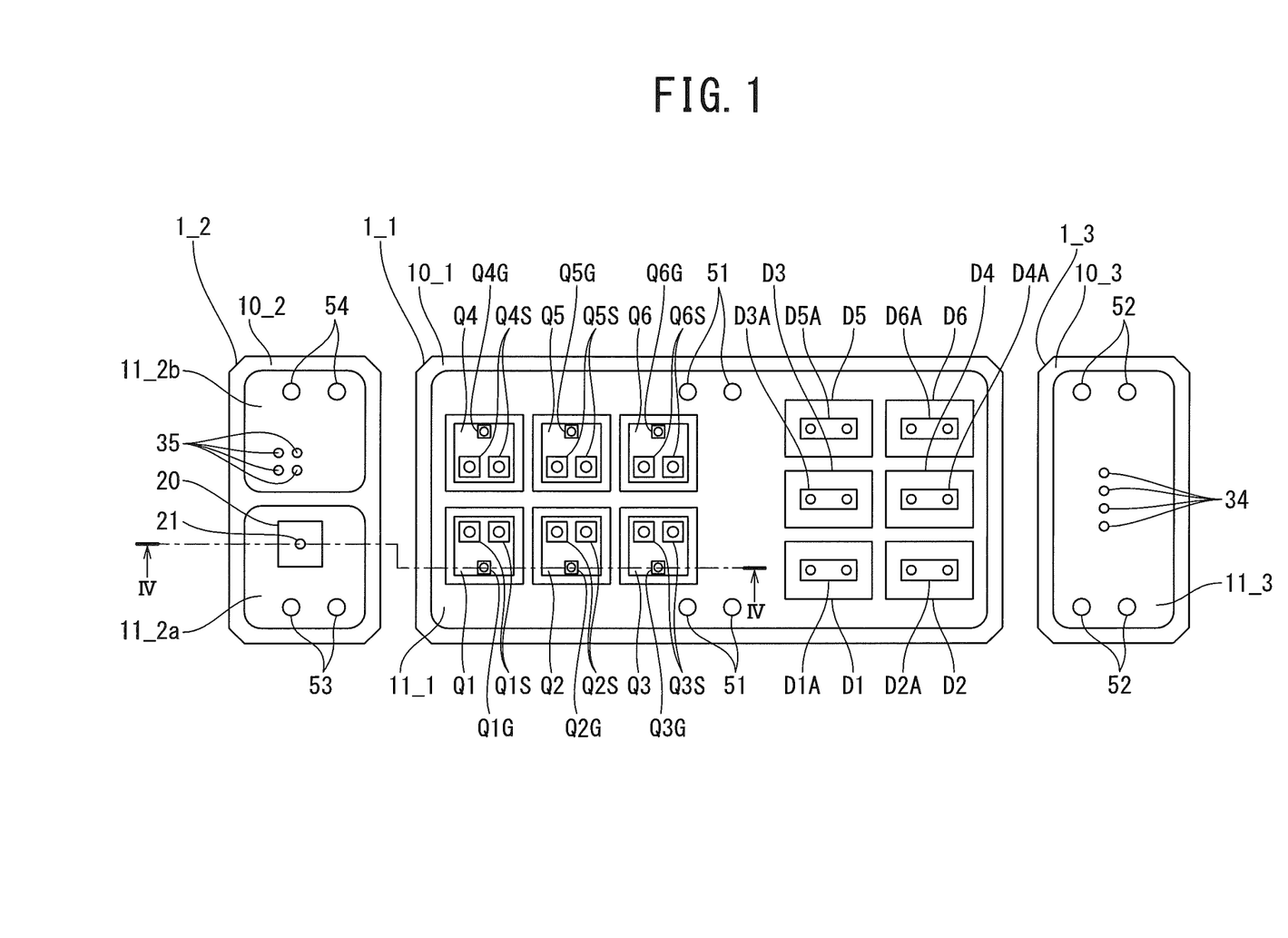
FIG. 1 is a top view illustrating a plurality of cooling plates of a power semiconductor device according to an embodiment of the present invention.
Figure 4:
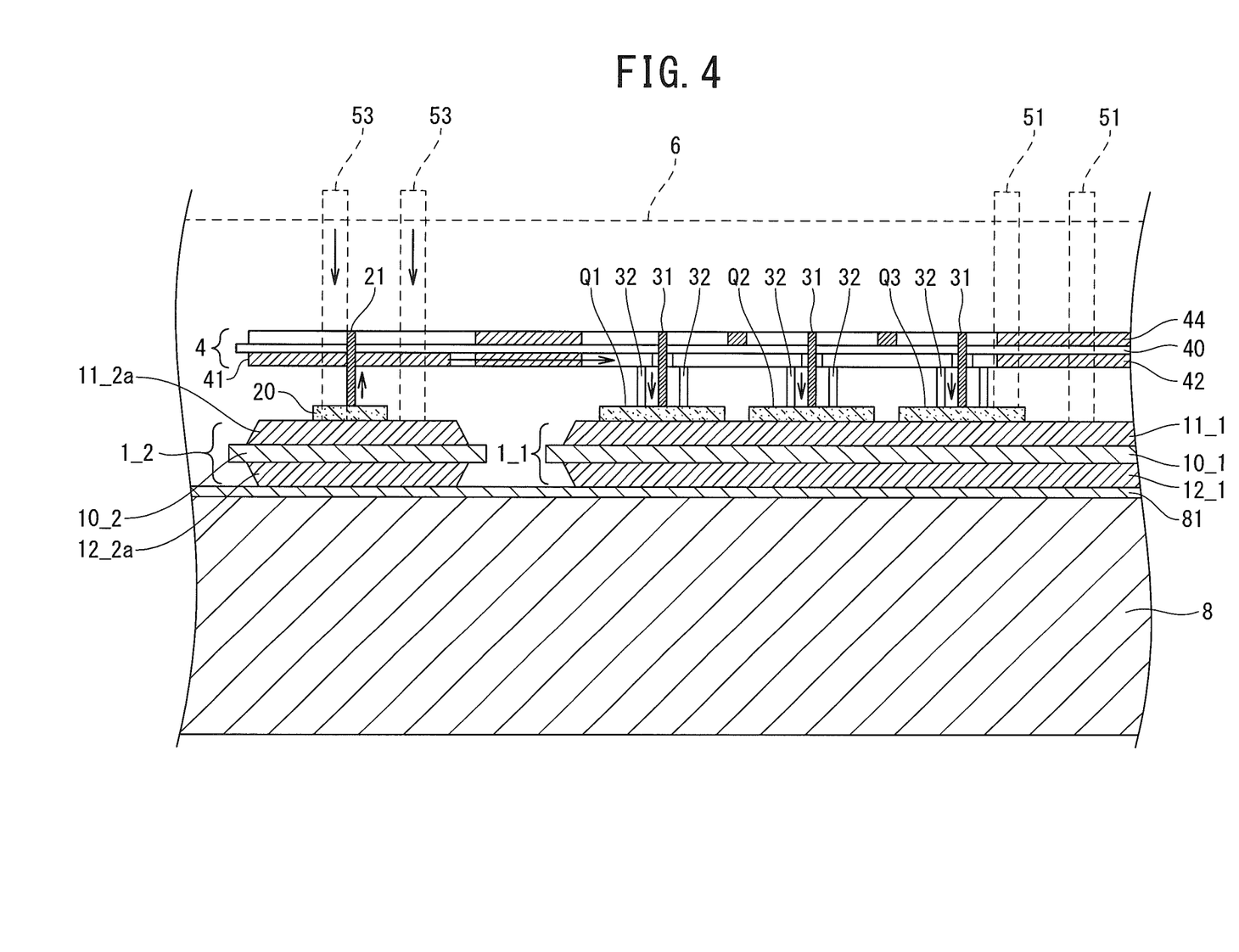
FIG. 4 is a cross-sectional view of the power semiconductor device according to the embodiment of the present invention, taken along line IV-IV of FIGS. 1 to 3.

As illustrated in FIG. 1, a power semiconductor device according to an embodiment of the present invention includes a plurality of cooling plates, such as a first cooling plate 1_1, a second cooling plate 1_2 and a third cooling plate 1_3. As illustrated in FIG. 4, the first cooling plate 1_1, the second cooling plate 1_2 and the third cooling plate 1_3 are arranged on an upper surface of a heat sink 8 illustrated in FIG. 4. A plurality of semiconductor elements Q1, Q2, Q3, Q4, Q5 and Q6 are mounted on the first cooling plate 1_1, and a control resistor 20 is mounted on the second cooling plate 1_2. In the power semiconductor device according to the embodiment, as illustrated in FIG. 4, a wiring board 4 is disposed above a plurality of cooling plates 1_1, 1_2 and 1_3. As illustrated in FIGS. 1 to 4, the power semiconductor device according to the embodiment further includes a plurality of pins 21, 31, 32, 33, 34, 35 held on the wiring board 4 and a plurality of terminals 51, 52, 53, 54, and a sealing member 6.

The first cooling plate 1_1 is implemented by a stacked structure, which includes a first insulating substrate 10_1 having a rectangular flat-plate shape, a first conductive layer 11_1 bonded on the upper surface of the first insulating substrate 10_1, and a heat-transfer layer 12_1 bonded on the lower surface of the first insulating substrate 10_1. The first insulating substrate 10_1 has a size defining the outer shape of the first cooling plate 1_1 as a planar pattern. As illustrated in FIGS. 1 and 4, the first heat-transfer layer 12_1 has a pattern substantially similar to the first insulating substrate 10_1 and is disposed with a smaller area than the first insulating substrate 10_1. A pattern of the first heat-transfer layer 12_1 is bonded to an area corresponding to a pattern of the first conductive layer 11_1 in the lower surface of the first insulating substrate 10_1, and coincides with the pattern of the first conductive layer 11_1 as a planar pattern.

The second cooling plate 1_2 includes a second insulating substrate 10_2 having a rectangular flat-plate shape, a second conductive layer 11_2a bonded on a part of the upper surface of the second insulating substrate 10_2, and a second heat-transfer layer 12_2a bonded on apart of the lower surface of the second insulating substrate 10_2. The second insulating substrate 10_2 has a size defining the outer shape of the second cooling plate 1_2 as a planar pattern. A pattern of the second heat-transfer layer 12_2a is bonded to an area corresponding to a pattern of the second conductive layer 11_2a in the lower surface of the second insulating substrate 10_2, and coincides with the pattern of the second conductive layer 11_2a as a planar pattern.

As illustrated in FIG. 1, the second cooling plate 1_2 further includes a pattern of a detection conductive layer 11_2b bonded on the upper surface of the second insulating substrate 10_2 separated from the pattern of the second conductive layer 11_2a. A pattern of the second cooling plate 1_2 is bonded to an area corresponding to a pattern of the detection conductive layer 11_2b in the lower surface of the second insulating substrate 10_2, and further includes a detection heat-transfer layer (not shown) which coincides with the pattern of the detection conductive layer 11_2b as a planar pattern.

As illustrated in FIG. 1, the third cooling plate 1_3 includes a third insulating substrate 10_3 having a rectangular flat-plate shape, a pattern of a third conductive layer 11_3 bonded on the upper surface of the third insulating substrate 10_3, and a third heat-transfer layer (not shown) bonded on the lower surface of the third insulating substrate 10_3. The third insulating substrate 10_3 has a size defining the outer shape of the third cooling plate 1_3 as a planar pattern. A pattern of the third heat-transfer layer is bonded to an area corresponding to the pattern of the third conductive layer 11_3 in the lower surface of the third insulating substrate 10_3, and coincides with the pattern of the third conductive layer 11_3 as a planar pattern.

The second cooling plate 1_2 is disposed so that one of long sides of the second cooling plate 1_2 faces a short side of the first cooling plate 1_1 in parallel. The third cooling plate 1_3 is disposed so that one of long sides of the third cooling plate 1_3 faces another short side of the first cooling plate 1_1 in parallel. As a result, the first cooling plate 1_1, the second cooling plate 1_2 and the third cooling plate 1_3 are arranged in an area which is roughly a rectangular flat-plate shape.

As illustrated in FIG. 4, the first to third cooling plates 1_1, 1_2, 1_3 are arranged in the same horizontal level so that each heat-transfer layer can be in contact with the flat upper surface of the heat sink 8 by using a thermal grease 81. That is, the lower surfaces of the heat-transfer layers of the first to third cooling plates 1_1, 1_2, 1_3 have the same level with each other. In addition, each of the first to third insulating substrates 10_1, 10_2, 10_3 has the same thickness. Also, each of the first to third conductive layers 11_1, 11_2a, 11_3, the detection conductive layers 11_2b, the first and second heat-transfer layers 12_1, 12_2 has the same thickness. In this case, the first to third conductive layers 11_1, 11_2a, 11_3, and the detection conductive layers 11_2b are arranged on the same plane to be separated from each other.

For the first to third cooling plates 1_1, 1_2, 1_3, a direct copper bonding (DCB) plate in which copper is bonded to a surface of a ceramic substrate by eutectic bonding, an active metal brazing (AMB) plate having a metal provided on a surface of ceramic substrate by AMB method or the like may be used. For a material of the ceramic substrate, for example, a material having high thermal conductivity, such as alumina ($Al_2O_3$), aluminum nitride (AlN), silicon nitride ($Si_3N_4$), or the like may be used. A metal, such as copper (Cu), aluminum (Al) or the like may be used for a material of the conductive layer and the heat-transfer layer. The first to third cooling plates 1_1, 1_2, 1_3 may have a bonding material provided between the conductive layer and the heat-transfer layer, or may have an insulating substrate of a multilayer structure. The thicknesses of the conductive layer and the heat-transfer layer are determined to be, for example, about 0.5 millimeter to 1.5 millimeters in consideration of heat conduction, stress, manufacturing cost and the like.

As illustrated in FIG. 4 where apart of the cross section is shown, semiconductor elements Q1, Q2, Q3, Q4, Q5, Q6 are bonded to the upper surface of the first cooling plate 1_1 by using a bonding material. When the longitudinal direction of the first cooling plate 1_1 is defined as the "row direction", the semiconductor elements Q1 to Q6 are arranged in a matrix of 2 rows×3 columns, in the one side (the left side in FIG. 1) along the row direction on the upper surface of the first conductive layer 11_1. The number of the semiconductor elements Q1 to Q6 is not limited to 6, but may be 2 or more, and the arrangement is not limited to a matrix.

Transistors, such as a field effect transistor (FET), a bipolar junction transistor (BJT), a static induction transistor (SIT), an insulated gate bipolar transistor (IGBT), and the like, can be adopted as the semiconductor elements Q1 to Q6. Alternatively, the semiconductor elements Q1 to Q6 may include thyristors, such as a static induction (SI) thyristor, a gate turn-off (GTO) thyristor, and the like.

When the semiconductor elements Q1 to Q6 are BJT and the like, the first main electrode denotes either one of the emitter electrode or the collector electrode, the second main electrode denotes the other electrode, and the control electrode denotes the base electrode. When the semiconductor elements Q1 to Q6 are FETs and the like, the first main electrode denotes either the source electrode or the drain electrode, the second main electrode denotes the other electrode, and the control electrode denotes the gate electrode. In the case of thyristor, the first main electrode denotes either the anode electrode or the cathode electrode, the second main electrode denotes the other electrode, and the control electrode denotes the gate electrode. For a material of the semiconductor elements Q1 to Q6, for example, silicon (Si) and the like can be used in addition to a wide band gap semiconductor, such as silicon carbide (SiC), gallium nitride (GaN), and the like.

Each of the semiconductor elements Q1 to Q6 preferably has, for example, a flat-plate shape, and a vertical structure including a first main electrode and a control electrode which are disposed on the first main surface, and a second main electrode disposed on the second main surface opposed to the first main surface. Each second principal surface of the semiconductor elements Q1 to Q6 is bonded to the upper surface of the first conductive layer 11_1 in such a direction that each first main surface on which the control electrode is located faces upward. Hereinafter, description will be given using a MOSFET as each of the semiconductor elements Q1 to Q6, and thus, the first main electrode will be a source electrode, the second main electrode will be a drain electrode, and the control electrode will be a gate electrode.

As illustrated in FIG. 1, the semiconductor element Q1 has two source electrodes Q1S and one control electrode (gate electrode) Q1G arranged on the upper surface thereof. That is, the drain electrode of the semiconductor element Q1 is disposed on the lower surface and is electrically connected to the first conductive layer 11_1. Likewise, two source electrodes Q2S, Q3S, Q4S, Q5S, Q6S and one control electrode (gate electrode) Q2G, Q3G, Q4G, Q5G, Q6G are disposed on each of the top surfaces of the semiconductor elements Q2 to Q6, and the drain electrodes disposed on the bottom surfaces are electrically connected to the first conductive layer 11_1, respectively.

The power semiconductor device according to the embodiment further includes a plurality of diodes D1, D2, D3, D4, D5, D6 mounted on a region of the upper surface of the first conductive layer 11_1 excluding a region where the semiconductor elements Q1 to Q6 are disposed. That is, the diodes D1 to D6 are disposed on the other side (the right side in FIG. 1) in the longitudinal direction of the first cooling plate 1_1. Each of the diodes D1 to D6 has, for example, a flat-plate shape, and a vertical structure in which the respective anode electrodes D1A, D2A, D3A, D4A, D5A, D6A are arranged on the first main surface and respective cathode electrodes are disposed on the second main surface opposed to the first main surface, respectively.

Each cathode electrode of the diodes D1 to D6 is bonded on the upper surface of the first conductive layer 11_1 in such a direction that each of the anode electrodes D1A to D6A faces upward. The cathode electrodes of the diodes D1 to D6 are electrically connected to the first conductive layer 11_1, respectively. The diodes D1 to D6 are connected in antiparallel to the semiconductor elements Q1 to Q6, respectively.

As illustrated in FIGS. 1 and 4, the control resistor 20 is mounted on the upper surface of the second cooling plate 1_2. Specifically, the control resistor 20 is bonded to the upper surface of the second conductive layer 11_2a by using a bonding material. The control resistor 20 has, for example, a flat-plate shape, and a vertical structure in which a current flows from the first main surface to the opposing second main surface is preferable. The control resistor 20 is usually made of a material having a temperature characteristic such that the resistance value increases as the temperature rises.

Figure 2:
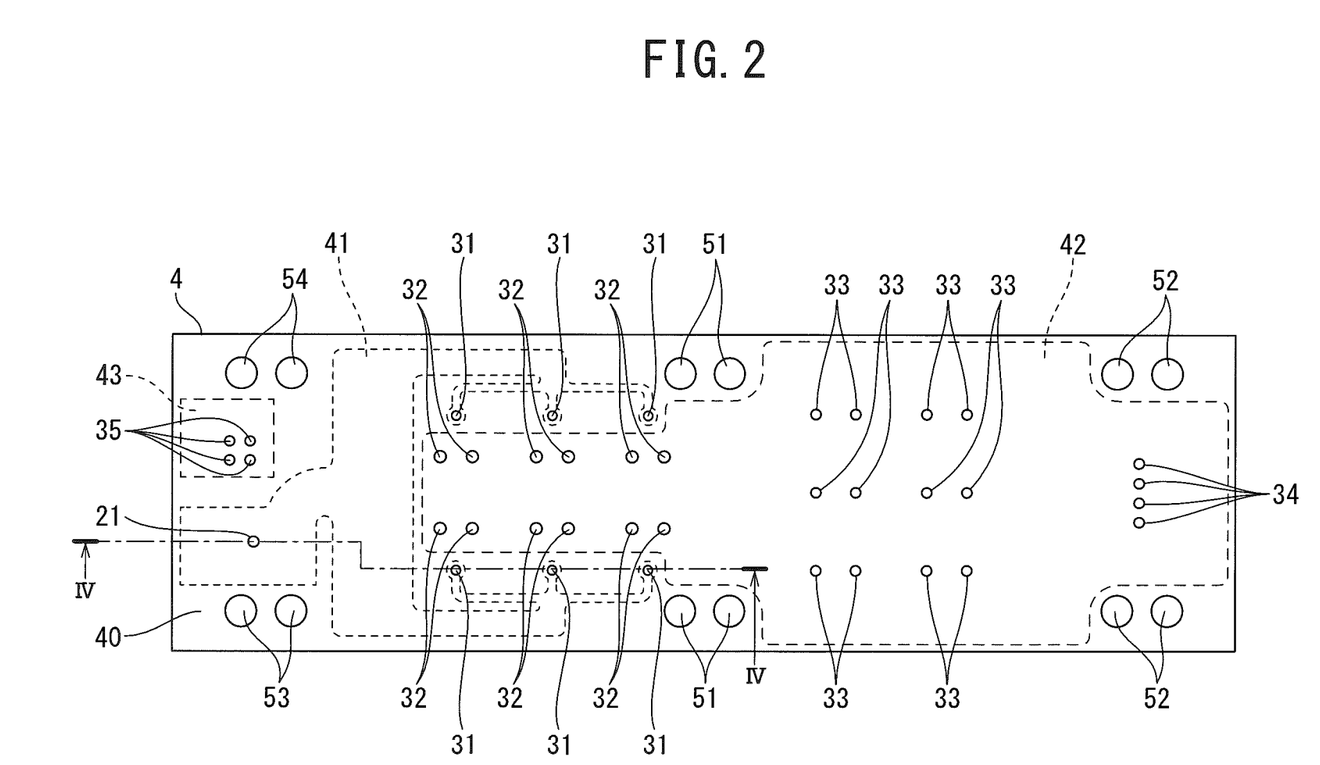
FIG. 2 is a plan view illustrating a wiring board of the power semiconductor device according to the embodiment of the present invention, in which an upper conductor pattern-layer is omitted and positions of lower conductor pattern-layers are indicated by hidden lines.
Figure 3:
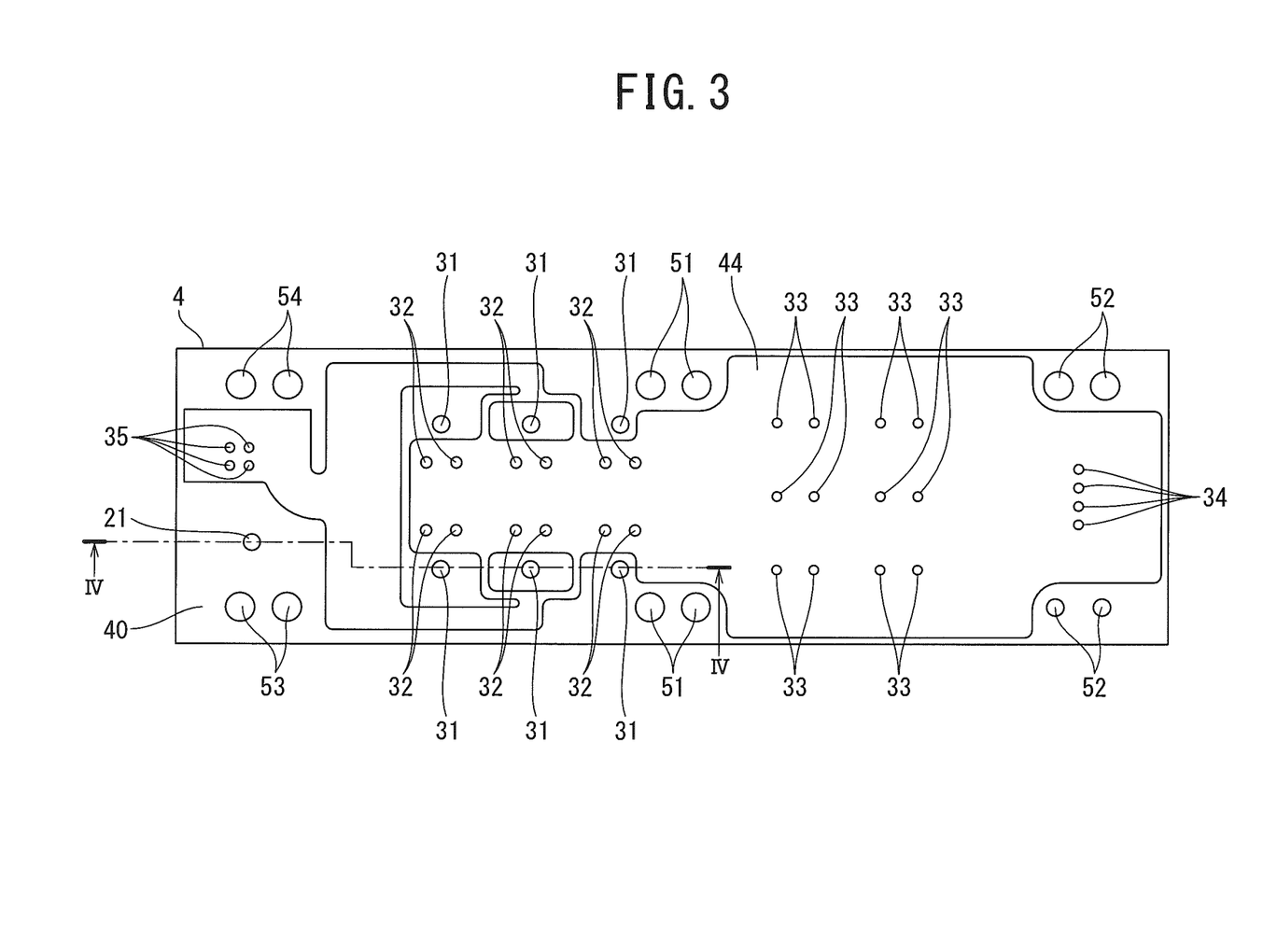
FIG. 3 is a plan view seen from the same direction as FIG. 2 and illustrating the upper conductor pattern-layer which is omitted in FIG. 2.

As illustrated in FIGS. 2 to 4, the wiring board 4 includes an insulating substrate 40 having a rectangular flat-plate shape, lower wiring layers 41, 42, 43 disposed on the lower surface of the insulating substrate 40, and an upper wiring layer 44 disposed on the upper surface of the insulating substrate 40. FIG. 2 and FIG. 3 are top views as seen from the same direction, and illustration of the upper wiring layer 44 is omitted in FIG. 2 for the sake of clarity. As indicated by a hidden line (broken line) in FIG. 2, the lower wiring layers 41, 42, 43 has a control-wiring layer 41, a source wiring layer 42 and a detection wiring layer 43. The upper wiring layer 44 omitted in FIG. 2 is shown in FIG. 3. The control-wiring layer 41, the source wiring layer 42, the detection wiring layer 43, and the upper wiring layer 44 are conductive films provided on the surface of the insulating substrate 40, respectively.

In FIG. 4, respective pins 21, 31 are held vertically with respect to the wiring board 4, and a plurality of through-holes in which a plurality of pins 21, 31, 32, 33, 34, 35 are inserted from the upper surface to the lower surface of the wiring board 4 are formed in the wiring board 4. The pins 21, 31 to 35 are, for example, implant pins which are previously inserted into the respective through-holes of the insulating substrate. Thus, the wiring board 4 is an implant-type printed circuit board in which a plurality of implant pins are previously inserted in the respective through-holes. As illustrated in FIGS. 1 to 4, the pins 21, 31 to 35 are aligned so as to correspond to the respective circuit elements arranged on the cooling plates 1_1, 1_2, 1_3. The surface direction of the wiring board 4 is aligned with the respective cooling plates 1_1, 1_2, 1_3 in parallel to each other.

As illustrated in FIG. 4, the sealing member 6 seals the semiconductor elements Q1 to Q6, the control resistor 20, the diodes D1 to D6, the wiring board 4, and the pins 31 to 35, but the lower surfaces of the cooling plates 1_1 to 1_3 are exposed. The sealing member 6 is made of, for example, a resin containing epoxy resin as a main component.

A control-resistor pin 21, a plurality of control-electrode pins 31, a plurality of source electrode pins 32, a plurality of diode pins 33, a plurality of source terminal pins 34, and a plurality of detection terminal pins 35 are exemplified as the pins 21, 31 to 35.

The wiring board 4 holds the control-electrode pins 31 by the through-holes formed at respective positions corresponding to the control electrodes Q1G, Q2G, Q3G, Q4G, Q5G, Q6G. The lower ends of the control-electrode pins 31 are bonded to the control electrodes Q1G to Q6G by using a bonding material. The wiring board 4 holds the control-resistor pin 21 by the through-hole formed at a position corresponding to the control resistor 20. The lower end of the control-resistor pin 21 is bonded to the upper surface of the control resistor 20 by using a bonding material.

As illustrated in FIG. 2, the control-wiring layer 41 extends from the control-resistor pin 21 to the control-electrode pins 31, respectively. Thus, the control-wiring layer 41 electrically connects each of the control electrodes Q1G to Q6G of the semiconductor elements Q1 to Q6 and the control resistor 20 by the control-resistor pin 21 and the control-electrode pins 31. The control-wiring layer branches into two in a U shape on paths from the control-resistor pin 21 to the semiconductor elements Q1 to Q6. The line width of the wiring in the column direction connecting the paths in the two row directions toward the semiconductor elements Q1 to Q6 in the U shape is wider than the others. The control-wiring layer 41 has a mirror image symmetry with respect to the center line in the width direction of the wiring board 4 from the point of branching into two to the control-electrode pins 31.

The wiring board 4 holds the source electrode pins 32 by the through-holes formed at respective positions corresponding to the source electrodes Q1S, Q2S, Q3S, Q4S, Q5S, Q6S. The lower ends of the source electrode pins 32 are bonded to the source electrodes Q1S to Q6S by using a bonding material. The wiring board 4 holds the diode pins 33 by the through-holes formed two by two at positions corresponding to the anodes D1A to D6A of the diodes D1 to D6. The lower ends of the diode pins 33 are bonded to the anodes D1A to D6A by using a bonding material. The wiring board 4 holds the source terminal pins 34 by a plurality of through-holes formed at positions corresponding to the third conductive layer 11_3. The lower ends of the source terminal pins 34 are bonded to the upper surface of the third conductive layer 11_3 by using a bonding material.

As illustrated in FIG. 2, the source wiring layer 42 is arranged as a planar pattern so as to include the source electrode pins 32, the diode pins 33, and the source terminal pins 34. Thus, the source wiring layer 42 electrically connects the source electrodes Q1S to Q6S, the anodes D1A to D6A, and the third conductive layer 11_3 with each other.

The detection wiring layer 43 electrically connects the detection terminal pins 35 with each other, as illustrated in FIG. 2. The wiring board 4 holds the detection terminal pins by a plurality of through-holes formed at positions corresponding to the detection conductive layer 11_2b. The lower ends of the detection terminal pins 35 are bonded to the upper surface of the detection conductive layer 11_2b by using a bonding material.

As illustrated in FIG. 3, the upper wiring layer 44 is disposed so as to include the source electrode pins 32, the diode pins 33, the source terminal pins 34, and the detection terminal pins 35. Thus, the detecting conductive layer 11_2b is electrically connected to the source electrodes Q1S to Q6S.

As illustrated in FIGS. 1 to 4, the power semiconductor device according to the embodiment includes a plurality of drain terminals 51, a plurality of source terminals 52, a plurality of control terminals 53, and a plurality of detection terminals 54. Each of a plurality of terminals 51, 52, 53, 54 is a terminal made of a rod-like conductor and is disposed perpendicular to the cooling plates 1_1 to 1_3 and the wiring board 4. As partially shown in FIG. 4, the lower ends of the terminals 51 to 54 are bonded to the cooling plates 1_1 to 1_3 by using a bonding material, and the terminals 51 to 54 pass through a plurality of through-holes to expose the upper part from the sealing member 6 to the outside.

The drain terminals 51 are bonded to the upper surface of the first conductive layer 11_1 by using a bonding material. As illustrated in FIG. 2, for example, two drain terminals 51 are arranged on both end sides along the short side direction of the first cooling plate 1_1. The drain terminals 51 are the first main terminals electrically connected to the respective drain electrodes of the semiconductor elements Q1 to Q6 and the cathode electrodes of the diodes D1 to D6.

The source terminals 52 are bonded to the upper surface of the third conductive layer 11_3 by using a bonding material. As illustrated in FIG. 2, for example, two of the source terminals 52 are arranged on both end sides along the short side direction of the third cooling plate 1_3. The source terminals 52 are second main terminals electrically connected to the source electrodes Q1S to Q6S and the anode electrodes D1A to D6A.

The control terminals 53 are bonded to the upper surface of the second conductive layer 11_2a by using a bonding material. Thus, an electric circuit in which the single control resistor 20 is connected in series between the control terminals 53 and the control electrodes Q1G to Q6G is formed. As shown by arrows in FIG. 4, voltage signals applied to the control terminals 53 are sequentially transmitted through the second conductive layer 11-2a, the control resistor 20, the control-resistor pin 21, the control-wiring layer 41, and the control-electrode pins 31, and applied to the control electrodes Q1G to Q6G.

The detection terminals 54 are bonded to the upper surface of the detection conductive layer 11_2b by using a bonding material. Thus, the detection terminals 54 are electrically connected to the source electrodes Q1S to Q6S, and may be used as terminals for current detection.

Note that the power semiconductor device according to the embodiment may be manufactured using the following process, for example. Each of the semiconductor elements Q1 to Q6, the diodes D1 to D6, and the control resistor 20 is loaded after selectively applying solder paste to each mounting position in the first cooling plate 1_1 and the second cooling plate 1_2. Further, the pins 21, 31 to 35 inserted in the wiring board 4 are loaded after selectively applying solder paste to the bonding positions of the cooling plates 1_1 to 1_3, respectively.

Similarly, the terminals 51 to 54 are loaded after selectively applying solder paste to the bonding positions of the cooling plates 1_1 to 1_3, respectively. The solder paste may be applied by printing or a dispenser. By combining the cooling plates 1_1 to 1_3 on which circuit elements are mounted, the wiring board 4 into which the pins 21, 31 to 35 are inserted, and the terminals 51 to 54 using a jig made of carbon and the like and performing reflow process, bonding by soldering may be performed. Thus, a semiconductor-device unit including the cooling plates 1_1 to 1_3 on which the circuit elements are mounted, the wiring board 4 into which the pins (21 and 31 to 35) are inserted, and the terminals 51 to 54 may be fabricated. In addition, for the bonding material, besides solder paste, a conductive adhesive, a sintered metal such as Ag nanoparticles, and the like may be used.

Figure 5:
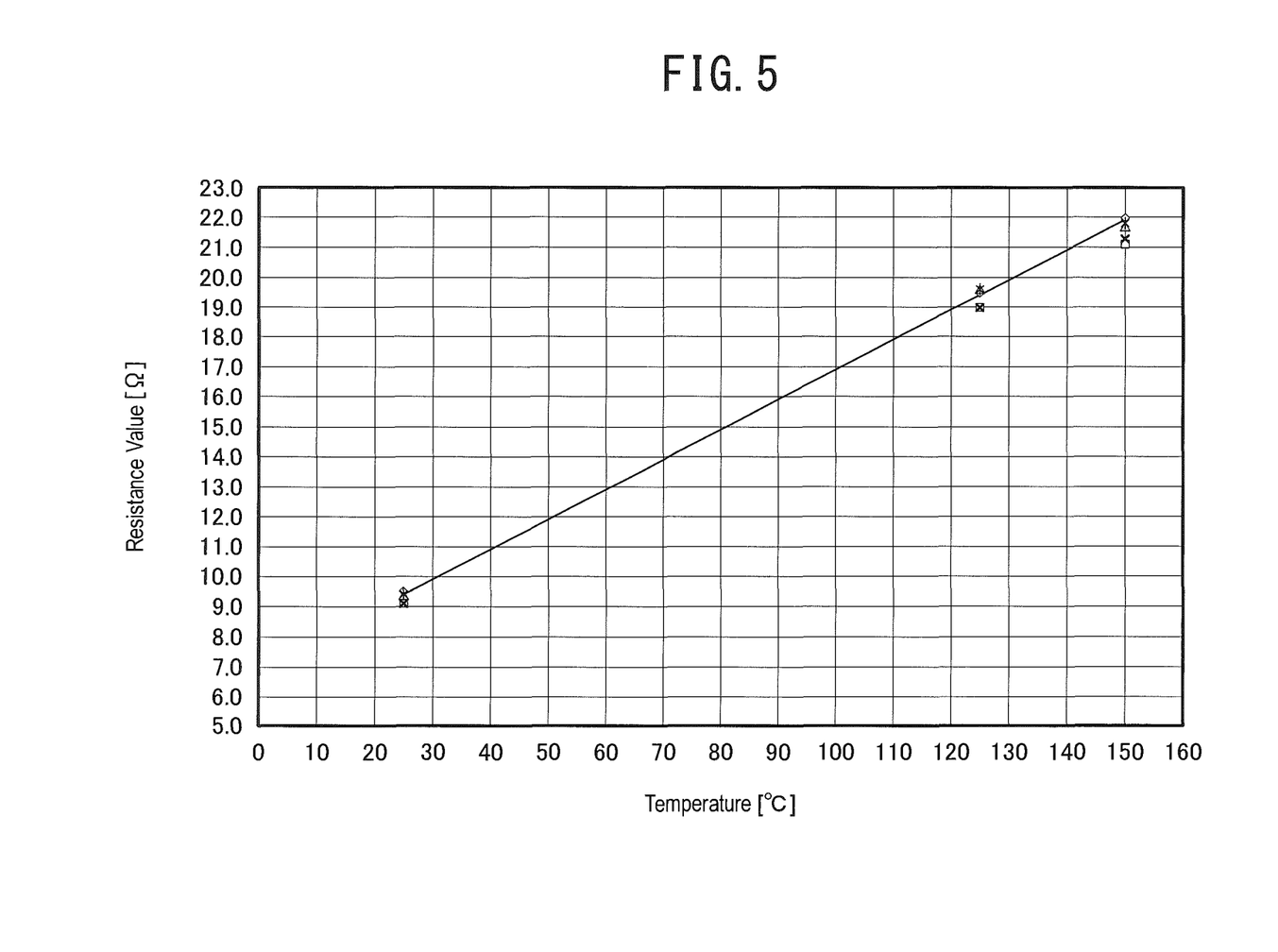
FIG. 5 is an example illustrating temperature characteristics of 10Ω chip resistors having a vertical structure.
Figure 6:
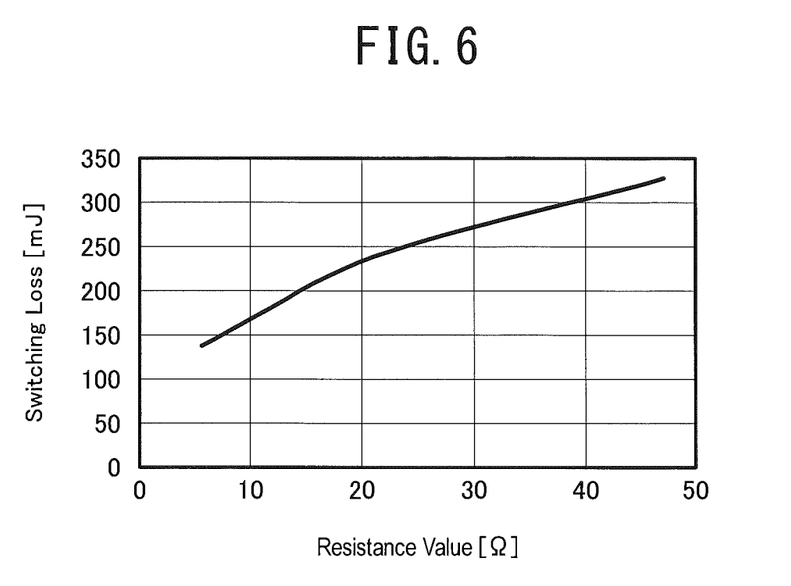
FIG. 6 is an example illustrating a characteristic of a switching loss with respect to a resistance value of a gate resistor.

As illustrated in FIG. 5, the resistance value of the resistor usually depends on temperature, and the resistance value rises as the temperature rises. When respective control resistors are disposed in the vicinity of individual semiconductor elements, variation in amounts of heat, which is generated by individual semiconductor elements, have an influence on the resistance values of the respective control resistors. As illustrated in FIG. 6, when a resistance value of the gate resistor connected to the control electrode (gate electrode) of the FET rises, a switching loss increases due to the increase of the turn-on delay time.

However, in the power semiconductor device according to the embodiment, since the control resistor 20 having the vertical structure is provided as a common control resistor for the semiconductor elements Q1 to Q6, the same resistance value can be applied to each of the semiconductor elements Q1 to Q6. That is, since the single control resistor 20 is connected to each of the control electrodes Q1G to Q6G by the control-resistor pin 21, the wiring board 4 and the control-electrode pin 31, variation in switching characteristics due to the control resistor can be prevented. Furthermore, in the power semiconductor device according to the embodiment, an increase in size can be prevented, and thus, it is possible to downsize the power semiconductor device. In addition, since the control resistor 20 is mounted on the second conductive layer 11_2a separated from the first conductive layer 11_1 on which the semiconductor elements Q1 to Q6 are mounted, the influence of heat from the semiconductor elements Q1 to Q6 may be reduced. Thus, in the control resistor 20, the temperature rise due to the heat generation of the semiconductor elements Q1 to Q6 may be prevented and it is possible to reduce variation in the resistance value.

Figure 7:
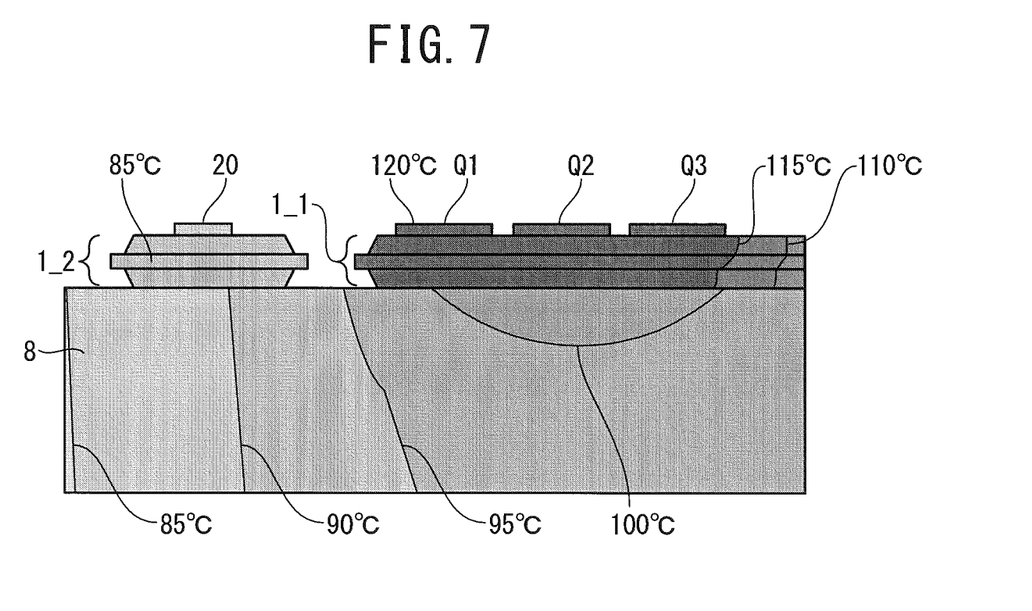
FIG. 7 is a simulation result illustrating a temperature distribution in a region corresponding to the cross-sectional view of FIG. 4 of the power semiconductor device according to the embodiment of the present invention.

As illustrated in FIG. 7, when the temperatures of the semiconductor elements Q1, Q2, Q3 are 120° C., the first cooling plate 1_1 directly below the semiconductor elements Q1 to Q3 is 115° C. and the area of the heat sink 8 located directly below the first cooling plate 1_1 is 100° C. That is, the semiconductor elements Q1 to Q3 are driven to generate heat, and the temperature in the area in the vicinity of the semiconductor elements Q1 to Q3 increases. However, since the control resistor 20 is mounted on the second cooling plate 1_2 which is separated from the first cooling plate 1_1, thermal coupling with the semiconductor elements Q1 to Q3 is reduced and the temperature of the control resistor 20 is 85° C. In particular, as illustrated in FIG. 7, the lower surface of the second cooling plate 1_2 on which the control resistor 20 is mounted can be bonded to the heat sink 8. Thus, the temperature rise of the control resistor 20 mounted on the upper surface of the second conductive layer 11_2a which is thermally connected to the heat sink 8 can be further reduced. Consequently, in the power semiconductor device according to the embodiment, the variation of the resistance value of the control resistor 20 can be reduced, and it is possible to reduce the influence of the variation of the resistance value of the control resistor 20 for the semiconductor elements Q1 to Q6.

Further, in the power semiconductor device according to the embodiment, the single control resistor 20 can be concurrently connected to each of the control electrodes Q1G to Q6G through the control-resistor pin 21, the wiring board 4 and the control-electrode pins 31. Therefore, it is possible to prevent unevenness in switching operation of the semiconductor elements Q1 to Q6 due to the variation of the resistance values in the control resistors. In addition, in the power semiconductor device according to the embodiment, since electrical wiring is provided by the wiring board 4, it is possible to prevent an increase in inductance due to bonding wires and the like. Further, since the control-resistor pin 21 and the control-electrode pins 31 are connected by the control-wiring layer 41, variation in parasitic inductance for each gate line may be reduced. Therefore, in the power semiconductor device according to the embodiment, it is possible to achieve uniform switching operation of the semiconductor elements Q1 to Q6 and to prevent oscillation of the semiconductor elements Q1 to Q6.

OTHER EMBODIMENTS

While the present invention has been described above by reference to the embodiment, it should be understood that the present invention is not intended to be limited to the descriptions of the specification and the drawings implementing part of this disclosure. Various alternative embodiments, examples, and technical applications will be apparent to those skilled in the art according to this disclosure.

For example, a power semiconductor device including a plurality of component semiconductor-device units, excluding the sealing member 6, each of the component semiconductor-device units having a structure of the power semiconductor device according to the above-described embodiment, can be fabricated as a single unit, implementing one assembled semiconductor-device unit. For assembling the single semiconductor-device unit, the plural component units may be arranged and connected by a bus bar and the like between each terminal so as to be connected in parallel with each other. The bus bar may be joined to each terminal, for example, by spot welding, laser soldering or the like. After the component semiconductor-device units which are connected to each other by the bus bar and fixed with relative location to each other are installed in a mold, a heated resin is injected into the mold. Thereby, a power semiconductor device in which a lower surface of each heat-transfer layer and a part of the bus bar electrode are exposed can be manufactured.

Figure 8:
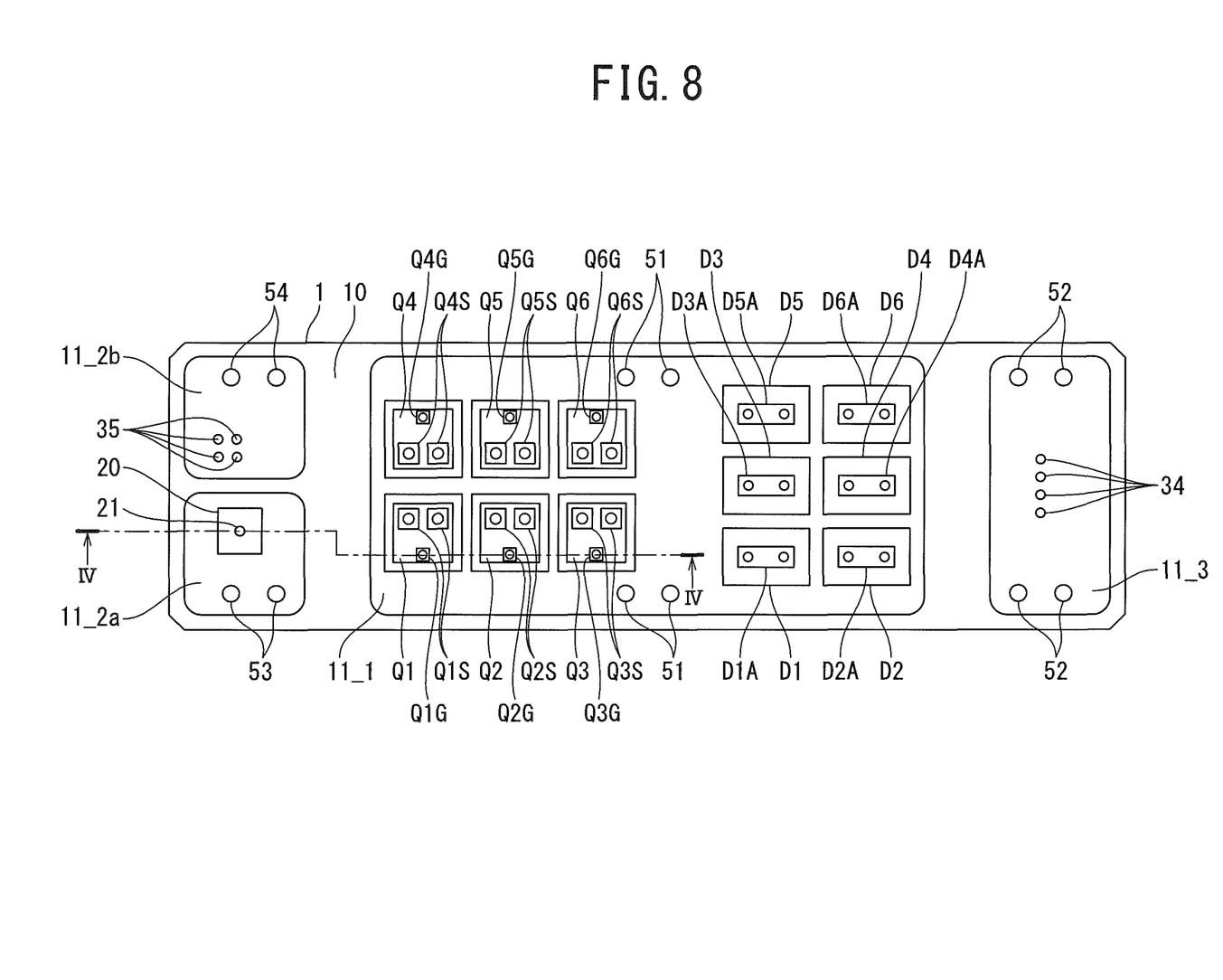
FIG. 8 is a top view illustrating a cooling plate of a power semiconductor device according to the other embodiment of the present invention.

In addition, as illustrated in FIG. 8, a power semiconductor device according to the other embodiment may be provided with a cooling plate 1 having a structure in which the cooling plates 1_1, 1_2, 1_3 in the power semiconductor device according to the above-described embodiment are integrated. The cooling plate 1 includes an insulating substrate 10 having a rectangular flat-plate shape, the first conductive layer 11_1, the second conductive layer 11_2a, the third conductive layer 11_3a and a detection conductive layer 11_2b which are bonded on the upper surface of the insulating substrate 10 so as to be separated from each other.

Although illustration is omitted in FIG. 8, the cooling plate 1 further has a first heat-transfer layer, a second heat-transfer layer, a third heat-transfer layer, and a detection heat-transfer layer which are bonded to the lower surface of the insulating substrate 10. The first conductive layer 11_1 coincides with the first heat-transfer layer, as a planar pattern. Similarly as a planar pattern, the second conductive layer 11_2a coincides with the second heat-transfer layer, the third conductive layer 11_3 coincides with the third heat-transfer layer, and the detection conductive layer 11_2b coincides with the detection heat-transfer layer, respectively.

Each of the semiconductor elements Q1 to Q6 and the control resistor 20 may be bonded to the heat sink by the conductive layer having high thermal conductivity, the insulating substrate 10 and the heat-transfer layer. Furthermore, the second conductive layer 11_2a on which the control resistor 20 is mounted is disposed to be separated from the first conductive layer 11_1 on which the semiconductor elements Q1 to Q6 are mounted. As a result, variation in the resistance value of the control resistor 20 can be reduced, and thus, it is possible to reduce the influence of the variation of the resistance value of the control resistor 20 to the semiconductor elements Q1 to Q6. In addition, since the cooling plate 1 is integrated, it is not necessary to perform alignment of the cooling plates 1_1 to 1_3 in the manufacturing process, and the manufacturing cost can be reduced.

Further, the control-resistor pin 21 connecting between the control-wiring layer 41 and the control resistor 20 is not limited to a pin-like conductor. The control-resistor pin 21 may be a conductor having another shape, such as a metal block and the like. Similarly, the terminals 51 to 54 are not limited to the rod shape, and may have a plate shape, a block shape or the like.

Furthermore, instead of disposing the control resistor 20 between the lower end of the control-resistor pin 21 and the second conductive layer 11_2a, the control resistor 20 may be mounted on the upper surface of the second conductive layer 11_2a. In this case, the lower end of the control terminal 53 may be electrically connected to one electrode (upper surface electrode) of the control resistor 20 with solder, and the lower end of the control-resistor pin 21 may be electrically connected to the other electrode (lower surface electrode) of the control resistor 20 by the second conductive layer 11_2a.

It should be noted that the present invention includes various embodiments which are not disclosed herein. Therefore, the scope of the present invention is defined only by the present invention specifying matters according to the claims reasonably derived from the description heretofore.

What is claimed is:

1. A power semiconductor device scheduled to be mounted on an upper surface of a heat sink, the power semiconductor device comprising:
    a first conductive layer designed to be disposed in parallel with the upper surface of the heat sink;
    a plurality of semiconductor elements having control electrodes, mounted on an upper surface of the first conductive layer, respectively;
    a second conductive layer designed to be thermally connected to an upper surface of the heat sink and mounted to separate from the first conductive layer;
    a control resistor having a first electrode and a second electrode, mounted on the upper surface of the second conductive layer;
    a control terminal electrically connected to the first electrode of the control resistor;
    a control-resistor pin electrically connected to the second electrode of the control resistor;
    a plurality of control-electrode pins connected to each of the control electrodes; and
    a wiring board having a control-wiring layer which holds the control-resistor pin and each of the control-electrode pins so as to electrically connect between the control-electrode pin and each of the control-resistor pins.

2. The power semiconductor device of claim 1, wherein the control resistor is a vertical resistor.

3. The power semiconductor device of claim 1, further comprising:
    a first insulating substrate having an upper surface bonded to a lower surface of the first conductive layer;
    a first heat-transfer layer bonded to a lower surface of the first insulating substrate;
    a second insulating substrate having an upper surface bonded to a lower surface of the second conductive layer; and
    a second heat-transfer layer bonded to the lower surface of the second insulating substrate.

4. The power semiconductor of claim 3, wherein the respective lower surfaces of the first heat-transfer layer and the second heat-transfer layer are in contact with the upper surface of the heat sink so as to the same level with each other.

5. The power semiconductor device of claim 1, further comprising:
    an insulating substrate having an upper surface bonded to respective lower surfaces of the first conductive layer and the second conductive layer;
    a first heat-transfer layer bonded to a lower surface of the insulating substrate; and
    a second heat-transfer layer bonded to the lower surface of the insulating substrate.

* * * * *

UNITED STATES PATENT AND TRADEMARK OFFICE
CERTIFICATE OF CORRECTION

PATENT NO. : 10,529,642 B2
APPLICATION NO. : 16/141026
DATED : January 7, 2020
INVENTOR(S) : Katsumi Taniguchi et al.

Page 1 of 1

It is certified that error appears in the above-identified patent and that said Letters Patent is hereby corrected as shown below:

In the Claims

Column 12, Line 17:
In Claim 4, after "semiconductor" insert -- device --.

Signed and Sealed this
Twenty-fifth Day of February, 2020

Andrei Iancu
*Director of the United States Patent and Trademark Office*